US012580014B2

(12) United States Patent
Hsiang et al.

(10) Patent No.: US 12,580,014 B2
(45) Date of Patent: Mar. 17, 2026

(54) MEMORY DEVICE AND OPERATION METHOD THEREOF

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Kuo-Yu Hsiang, Kaohsiung City (TW); Min-Hung Lee, New Taipei City (TW)

(73) Assignees: TAIWAN SEMICONDUCTOR MANUFACTURING COMPANY, LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 110 days.

(21) Appl. No.: 18/426,087

(22) Filed: Jan. 29, 2024

(65) Prior Publication Data

US 2025/0078894 A1 Mar. 6, 2025

Related U.S. Application Data

(60) Provisional application No. 63/579,873, filed on Aug. 31, 2023.

(51) Int. Cl.
*G11C 11/22* (2006.01)

(52) U.S. Cl.
CPC ........ *G11C 11/2297* (2013.01); *G11C 11/221* (2013.01); *G11C 11/2255* (2013.01)

(58) Field of Classification Search
CPC .............. G11C 11/2297; G11C 11/221; G11C 11/2255; G11C 11/22; G11C 11/2273; G11C 11/2275; G11C 11/2293

USPC ......................................................... 365/145
See application file for complete search history.

(56) References Cited

U.S. PATENT DOCUMENTS

| | | | |
|---|---|---|---|
| 2019/0066752 A1* | 2/2019 | Fackenthal | ........... G11C 11/221 |
| 2020/0357453 A1 | 11/2020 | Slesazeck et al. | |
| 2023/0245701 A1 | 8/2023 | Ghetti et al. | |
| 2023/0260576 A1 | 8/2023 | Fantini et al. | |

FOREIGN PATENT DOCUMENTS

TW 202303600 A 1/2023

OTHER PUBLICATIONS

Liao, P.J. et al., "Characterization of Fatigue and Its Recovery Behavior in Ferroelectric HfZrO," Symposium on VLSI Technology, (2021).

(Continued)

*Primary Examiner* — Huan Hoang
(74) *Attorney, Agent, or Firm* — Maschoff Brennan

(57) ABSTRACT

A memory device includes multiple first memory cells each having a first terminal coupled to a first node and a second terminal coupled to a corresponding one in multiple first bit lines; multiple second memory cells each having a first terminal coupled to a second node and a second terminal coupled to a corresponding one in multiple second bit lines; and a driver circuit coupled between the first node and the second node, and configured to generate, in response to a first voltage at the first node, a second voltage at the second node when a memory operation is performed to one of the first memory cells. The first voltage and the second voltage have different polarity.

20 Claims, 9 Drawing Sheets

(56) References Cited

OTHER PUBLICATIONS

Zheng, Y. et al., "Atomic-scale characterization of defects generation during fatigue in ferroelectric Hf0.5Zr0.O2 films: vacancy generation and lattice dislocation," IEEE International Electron Devices Meeting (IEDM), pp. 713-716 (2021).

Chang, Y.K. et al., "The Field-dependence Endurance Model and Its Mutual Effect in Hf-based Ferroelectrics," IEEE International Reliability Physics Symposium (IRPS), pp. 3A.1-1-3A. 1-5 (2022).

Hsiang, K.-Y. et al., "Novel Opposite Polarity Cycling Recovery (OPCR) of HfZrO2 Antiferroelectric-RAM with an Access Scheme Toward Unlimited Endurance," IEEE International Electron Devices Meeting (IEDM), pp. 763-766 (2022).

Peng, Y. et al., "HfO2—ZrO2 Superlattice Ferroelectric Capacitor With Improved Endurance Performance and Higher Fatigue Recovery Capability," IEEE Electron Device Letters, vol. 43, Issue 2, pp. 216-219 (Feb. 2022).

Hsiang, K.-Y. et al., "FeRAM Recovery up to 200 Periods with Accumulated Endurance 1012 Cycles and an Applicable Array Circuit toward Unlimited eNVM Operations," IEEE Symposium on VLSI Technology and Circuits (VLSI Technology and Circuits), (2023).

* cited by examiner

MEMORY DEVICE AND OPERATION METHOD THEREOF

CROSS REFERENCE

The present application claims priority to U.S. Provisional Application No. 63/579,873, filed on Aug. 31, 2023, which is herein incorporated by reference in its entirety.

BACKGROUND

Ferroelectric random access memory (FeRAM) employs device structures akin to volatile memory, yet it gains non-volatile characteristics by utilizing a ferroelectric capacitor as a storage component. Consequently, FeRAM devices can exhibit superior performance when compared to both volatile and non-volatile memory devices. Certain FeRAM implementations achieve this by dividing the sensing windows of a single storage mechanism multiple times, aiming to create distinct memory states.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
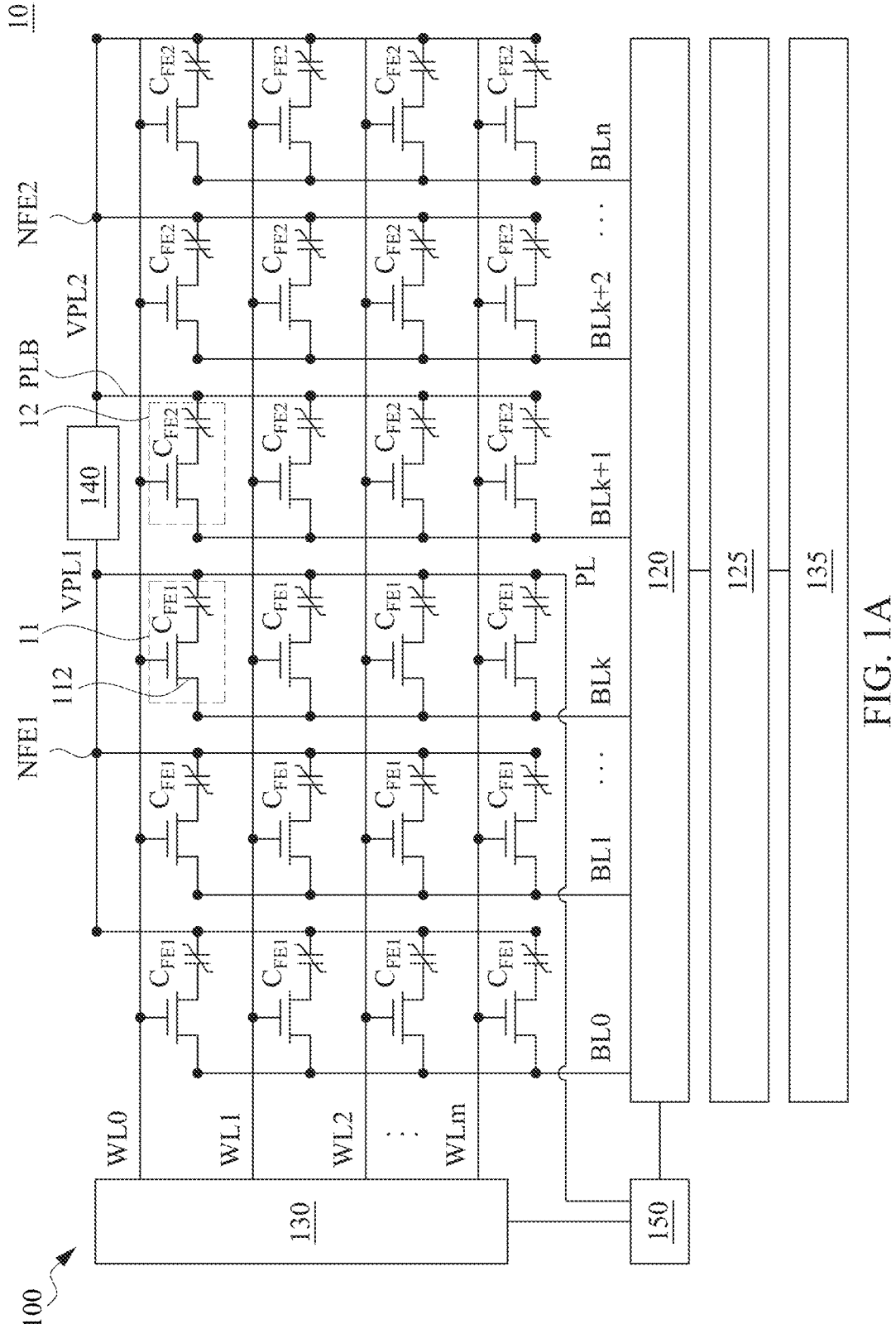
FIG. 1A is a schematic diagram of a memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

As used herein, "around", "about", "approximately" or "substantially" shall generally refer to any approximate value of a given value or range, in which it is varied depending on various arts in which it pertains, and the scope of which should be accorded with the broadest interpretation understood by the person skilled in the art to which it pertains, so as to encompass all such modifications and similar structures. In some embodiments, it shall generally mean within 20 percent, preferably within 10 percent, and more preferably within 5 percent of a given value or range. Numerical quantities given herein are approximate, meaning that the term "around", "about", "approximately" or "substantially" can be inferred if not expressly stated, or meaning other approximate values.

Reference is now made to FIG. 1A. FIG. 1A is a schematic diagram of a memory device 10, in accordance with some embodiments. For illustration, the memory array 100 includes memory cells 11 and 12 that are arranged in rows and columns. The memory cells 11 and 12 are programmable to store different states. Each of the memory cells 11 and 12 may be programmable to store two states, denoted as a state 0 and a state 1. In some embodiments, each of the memory cells 11 and 12 is configured to store more than two logic states (e.g., three or more values). In the embodiments of FIG. 1A, each of the memory cells 11 include a ferroelectric capacitor $C_{FE1}$ and can be referred to as ferroelectric memory cells. Each of the memory cells 12 include a ferroelectric capacitor $C_{FE2}$ and can be referred to as ferroelectric memory cells. The ferroelectric capacitor $C_{FE1}$ and the ferroelectric capacitor $C_{FE2}$ have ferroelectric dielectric material. Different levels of dipoles in the ferroelectric capacitors $C_{FE1}$ and $C_{FE2}$ represent different logic states. In some embodiments, some of the ferroelectric capacitors $C_{FE1}$ and $C_{FE2}$ store a first charge (or first portion of a charge) associated with a dielectric and a second charge (or second portion of a charge) associated with a polarization. Ferroelectric materials have non-linear polarization properties.

Memory operations such as read operation and a write operation are performed to the memory cells 11 and 12 by activating or selecting the appropriate one of word lines WL0-WLm and one of bit lines BL0-BLn. Activating or selecting a word line or a bit line include applying a voltage to the respective line. The word lines WL0-WLm and the bit lines BL0-BLn are made of conductive materials. For example, the word lines WL0-WLm and bit lines BL0-BLn may be made of metals (such as copper, aluminum, gold, tungsten, etc.), metal alloys, other conductive materials, or the like. According to the example of FIG. 1A, each row of the memory cells 11-12 is connected to one of the word line WL0-WLm. Each of the memory cells 11 has a first terminal coupled to a corresponding one in the bit lines BL0-BLk and a second terminal coupled to a plate line PL at a node NFE1. Each of the memory cells 12 has a first terminal coupled to a corresponding one in the bit lines BL0-BLn and a second terminal coupled to a plate line PLB at a node NFE2. By activating one word line, for example, WL0, one bit line, for example, BL0, and the plate line PL (e.g., applying a voltage to the word line WL0, the plate line PL, or bit line BL0), one memory cell, for example, 11 is accessed at their intersection.

Accessing the memory cells 11-12 may include a read operation or a write operation to the memory cells 11-12. The intersection of a word line and a bit line is referred to as an address of the memory cell. In some examples, a read operation may include sensing multiple levels from ferroelectric memory. These operations include sensing a polarization charge from a memory cell by causing the polarization charge to be received in a sense amplifier, and activating the sense amplifier. In some examples, based at least in part on the polarity of the dielectric charge and the polarization charge from the memory cell, the read operation includes sensing multiple levels from ferroelectric memory. In some examples, based at least in part on the polarity of the dielectric charge and the polarization charge from the memory cell, a read operation may be performed. In some examples, this read operation may include accessing a cell to determine a polarity of a dielectric charge at a first time, storing the determined dielectric charge polarity, accessing a cell (i.e., the same or a different cell) to determine a polarization charge from the memory cell, and then initiating one or more other actions based on the reading as described in various aspects of the present disclosure. In some embodiments, the read operations of the different charge-related information may be performed concurrently, in overlapping intervals, in series, in continuous intervals, or in parallel.

In some embodiments, the logic-storing device of the memory cell, e.g., the ferroelectric capacitors $C_{FE1}$ Or $C_{FE2}$, is electrically isolated from the bit line by a selection component 112 in the memory cells 11-12. In some embodiments, the selection component 112 includes a transistor having a gate terminal coupled to a corresponding word line, a source/drain terminal coupled to a cell bottom of the ferroelectric capacitor, and a drain/source terminal coupled to a cell plate of the ferroelectric capacitor.

In some embodiments, the word line controls the selection component 112. For example, activating the word line, for example, WLo, results in an electrical connection or closed circuit between the ferroelectric capacitor, for example, CFE1, of the memory cell 11 and its corresponding bit line. The bit line is then be accessed to either read or write the memory cell 11.

Accessing memory cells 11-12 is controlled through column address selection circuit 125 and a row address selection circuit 130. In some embodiments, the column address selection circuit 125 receives a column address from the control circuit 150 and activates the appropriate bit line. Similarly, the row address selection circuit 130 receives a row address from a control circuit 150 and activates the appropriate word line based on the received row address. For example, by activating the word line WL0 and the bit line BL0, the memory cell 11 at their intersection may be accessed.

Upon accessing, the memory cells 11-12 may be read, or sensed, by a sense circuit 120 to determine the stored state of the memory cells 11-12. For example, after accessing one of the memory cells 11-12, the ferroelectric capacitor of said memory cells 11-12 discharges a charge (e.g., a polarization charge) onto its corresponding bit line. In some embodiments, discharging the ferroelectric capacitor $C_{FE1}$ may be based on biasing, or applying a voltage VPL1, to the ferroelectric capacitor $C_{FE1}$ through the plate line PL. Discharging the ferroelectric capacitor $C_{FE2}$ may be based on biasing, or applying a voltage VPL2, to the ferroelectric capacitor $C_{FE2}$ through the plate line PLB.

As shown in FIG. 1A, the memory device 10 includes a driver circuit 140 that has an input terminal coupled to the node NFE1 and an output terminal coupled to the node NFE2. In some embodiments, when a memory operation, e.g., read operation or write operation, is performed to one of the memory cells 11-12, the driver circuit 140 is configured to generate, in response to the voltage VPL1 at the n1, the voltage VPL2 at the node NFE2. The voltage VPL1 and the voltage VPL2 have different polarity. For example, the voltage VPL1 has a positive voltage value, and the voltage VPL2 has a negative voltage value, accordingly to some embodiments. In another embodiment, the voltage VPL2 has a positive voltage value, and the voltage VPL1 has a negative voltage value. In some embodiments, the voltage VPL1 and the voltage VPL2 have a same absolute value.

Figure 1B:
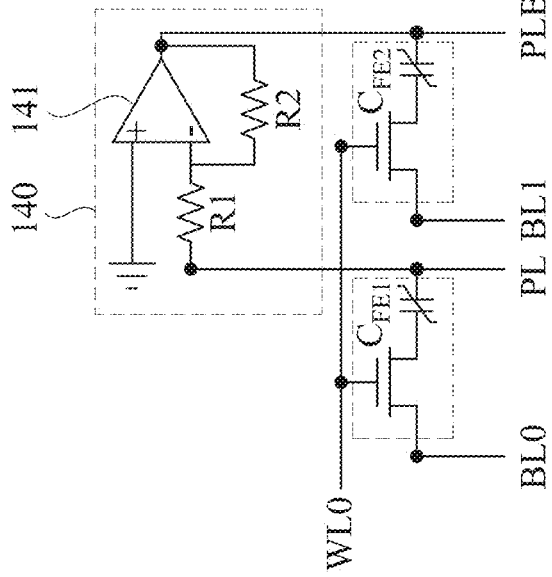
FIG. 1B is a schematic diagram of part of the memory device corresponding to FIG. 1A, in accordance with some embodiments.

In some embodiments, the driver circuit 140 includes an inverting amplifier 141 and resistors R1-R2 as shown in FIG. 1B. For illustration, the inverting amplifier 141 has a negative input terminal coupled to the plate line PL through the resistor R1 to receive the voltage VPL1 at the node NFE1 in FIG. 1A and also has a positive input terminal coupled to a ground. The output terminal of the inverting amplifier 141 is coupled to the plate line PLB at the node NFE2 in FIG. 1A. The resistor R1 is coupled between the negative input terminal and the node NFE1 in FIG. 1A. The resistor R2 is coupled between the negative input terminal of the inverting amplifier 141 and the node NFE2 in FIG. 1A.

The discharging induces a change in the voltage of the corresponding bit line, which the sense circuit 120 compares to a reference voltage (not shown) in order to determine the stored state of the memory cell. For example, when bit line has a higher voltage than the reference voltage, then sense circuit 120 determines that the stored state in memory cell is related to a first predefined logic value. In some embodiments, this first value may include a state 1, or may be another value-including other logic values associated with multi-level sensing that enables storing more than two values (e.g., 3 states per cell or 1.5 bits per cell). In some embodiments, predefined encoding logic values may be mapped into memory cell states for writing to and reading from the memory cell as described with reference to aspects of the present disclosure.

In some embodiments, the sense circuit 120 includes various transistors or amplifiers in order to detect and amplify a difference in the signals, which may be referred to as latching. The detected logic state of memory cell may then be output through the column address selection circuit 125 and an input/output circuit 135.

The memory cells 11-12 may be set, or written, by activating the relevant word line and bit line. As discussed above, activating a word line electrically connects the corresponding row of memory cells 11-12 to their respective bit lines. By controlling the relevant bit line while the word line is activated, one of the memory cells 11-12 is written—i.e., a state may be stored in the memory cell. The column address selection circuit 125 accepts data, for example through the input/output circuit 135, to be written to the memory cells 11-12.

Figure 2:
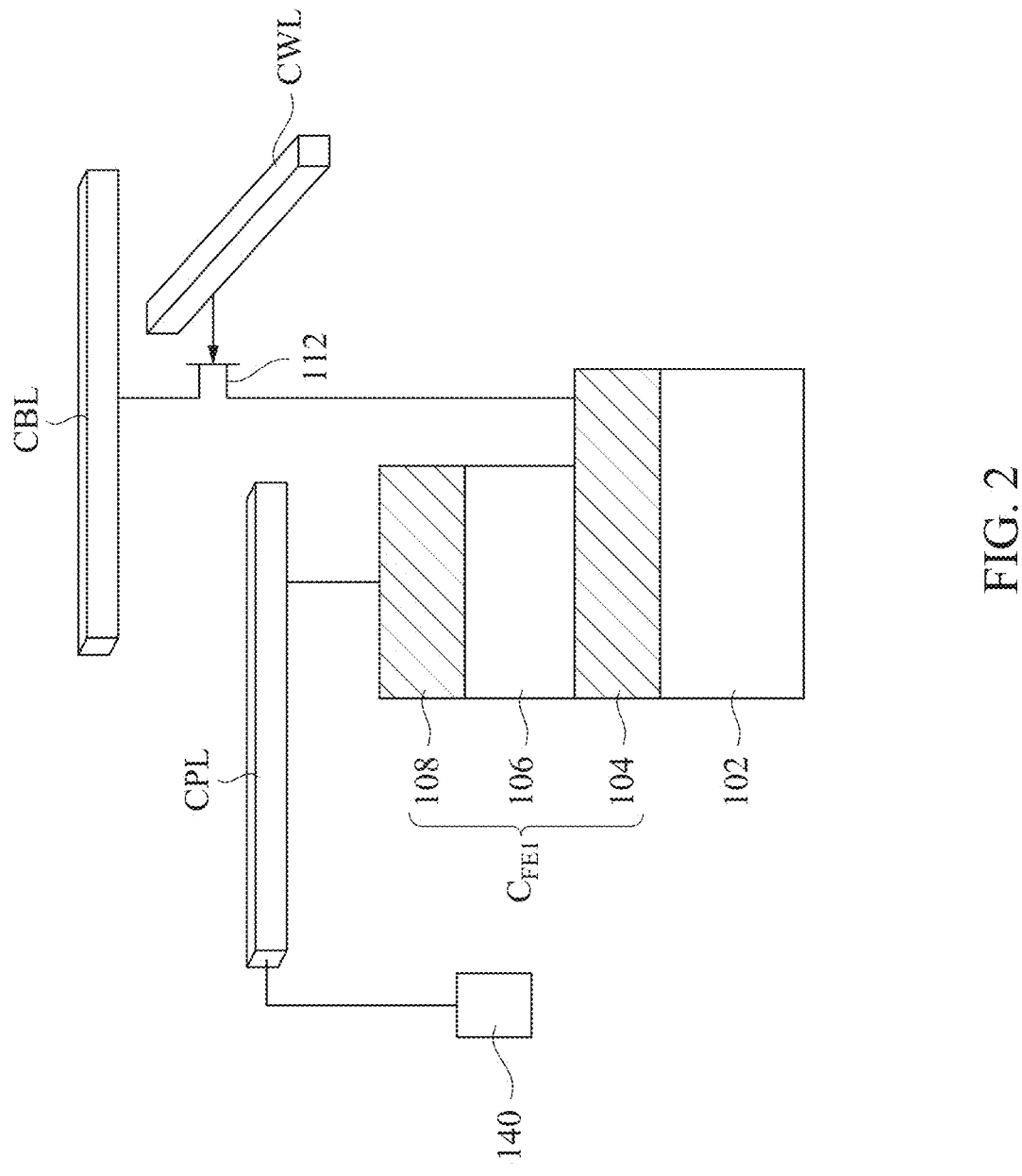
FIG. 2 illustrates part of the memory device corresponding to FIG. 1A, in accordance with some embodiments.

Reference is now made to FIG. 2. FIG. 2 illustrates part of the memory device 10 corresponding to FIG. 1A, in accordance with some embodiments. In some embodiments, the ferroelectric capacitors $C_{FE1}$ and $C_{FE2}$ in the memory cells 11 and 12 have similar configuration. Accordingly, the memory cell 11 is given as example for illustrative purposes with reference to FIG. 2.

The memory cell 11 includes a substrate 102, a bottom electrode 104 as a cell bottom, a variable resistance pattern 106 and a top electrode 108 as a cell plate, which are sequentially stacked. The bottom electrode 104, the variable resistance pattern 106 and the top electrode 108 constitute the ferroelectric capacitor $C_{FE1}$ for storing memory data. The bottom electrode 104 and the top electrode 108 are formed of, for example, a conductive material such as metal, alloy, a compound thereof, or a stack of metal, alloy, the compound thereof. Examples of the bottom electrode 104 and the top electrode 108 include suitable conductive materials, such as TaN, TiN, W, Pt, Mo, Ta, Ti, metal silicide, the like, and/or the combination thereof. The bottom electrode 104 and the top electrode 108 can be a single-layered structure or a multi-layered structure including plural stacked layers of metals and/or metal-containing compounds. In some embodiments, the bottom electrode 104 and the top electrode 108 each have a thickness in a range from about 1 nm to about 1000 nm.

In some embodiment, the variable resistance pattern 106 is an ferroelectric layer. In some embodiments, the variable resistance pattern 106 may include $HfZrO_2$ (HZO), HAO (Al-Doped $HfO_2$), HSO (Si-Doped $HfO_2$), lead zirconate titanate (PZT), strontium bismuth tantalit (SBT), and aluminium scandium nitride (AlScN). In some embodiments, the variable resistance pattern 106 has the composition of $Hf_{1-x}Zr_xO_2$ in which x ranges between around 0.5 to around 1, and thus can have a ferroelectric characteristic demonstrating a single hysteresis loop. In some embodiments, the variable resistance pattern 106 has a thickness in a range from about 0.1 nm to about 50 nm, such as about 10 nm. In use and operation, when the memory cell 11 is selected to be programmed, the voltage VPL1 with certain voltage value may be applied to the memory cell 11 to change a polarization state of the variable resistance pattern 106 of the memory cell 11. When the voltage VPL1 is removed, the variable resistance pattern 106 may exhibit a polarization. In a read operation of the memory cell 11, the voltage VPL1 with certain voltage value is used to detect a state of the variable resistance pattern 106.

The memory device 10 further includes a conductive line CBL that may function as a corresponding bit line in FIG. 1A, a conductive line CWL that may function as a corresponding word line in FIG. 1A, a conductive line CPL that may function as the plate line PL.

The configurations of the memory cell 12 are similar to the memory cell 11. Specifically, the cell plate of the ferroelectric capacitor $C_{FE2}$ in the memory cell 12 is coupled to the plate line PLB and the cell bottom thereof is coupled to a corresponding bit line. The repetitious descriptions are omitted here.

Figure 3:
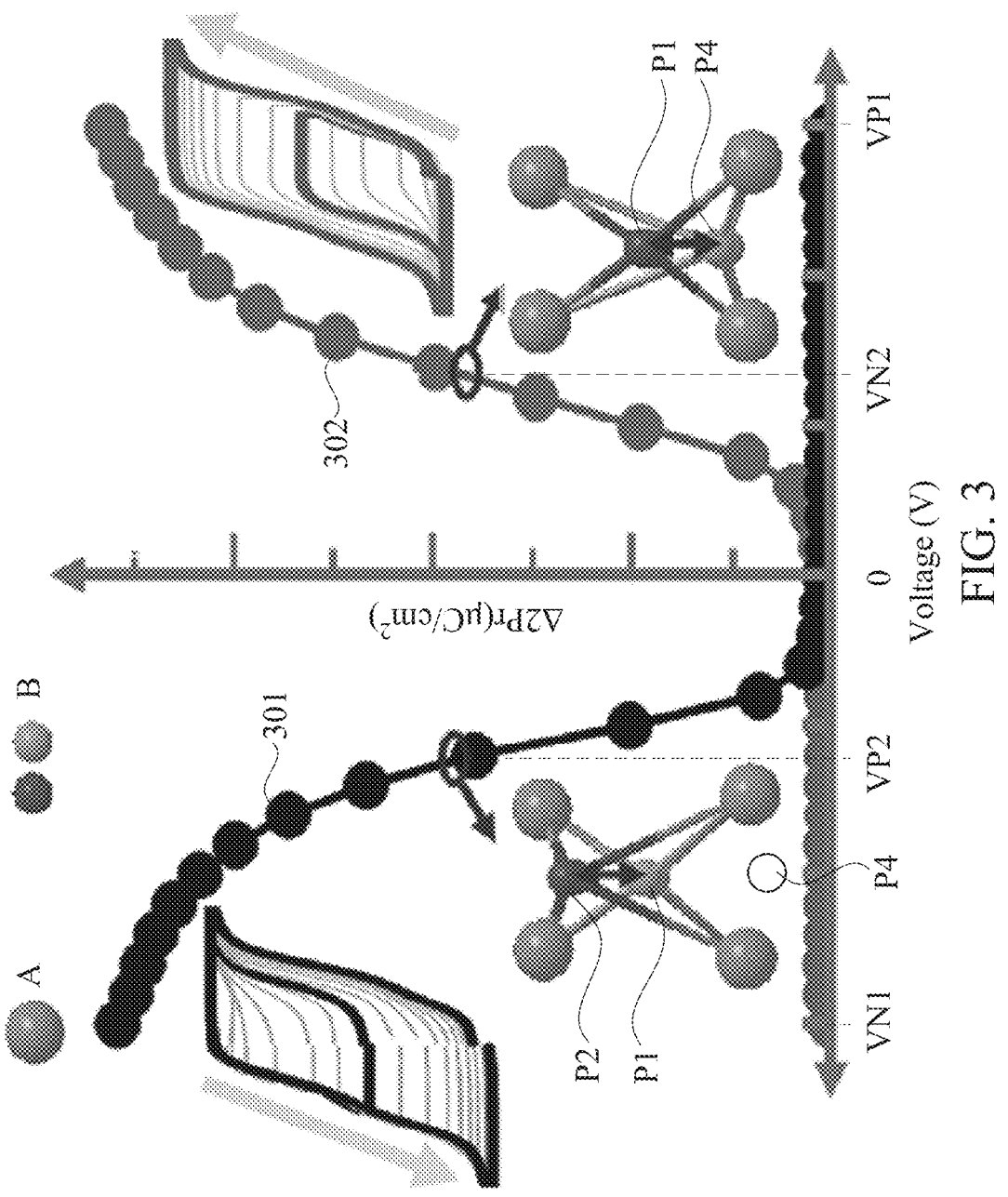
FIG. 3 shows switching polarizations-voltage ($\Delta 2P_r$-V) characteristic with regard to the memory cell in FIGS. 1A-2, in accordance with some embodiments.

FIG. 3 shows switching polarization-voltage ($\Delta 2P_r$-V) characteristic with regard to the memory cell 11 or 12 in FIGS. 1A-2, in accordance with some embodiments. In some embodiments, by performing multiple cycling operations of two different polarities to memory cells 11-12 through the control circuit 150 controlling the voltages VPL1, polarizations are established in the ferroelectric capacitors in the memory cells 11-12, which represent states of data stored in the memory cells 11-12.

For example, as shown by a positive polarity asymmetric minor loop (Pos. AmL) 301 in FIG. 3, the switching polarization ($\Delta 2P_r$) in the ferroelectric capacitor, for example, $C_{FE1}$, is expanded and half of the complete switching polarization is achieved as the voltage VPL1 applied on the cell plate of the ferroelectric capacitor cycles from a voltage VP1 to a voltage VP2. In some embodiments, the half of the complete switching polarization indicates sufficient dipole switching response polarization induced by the reversal field, in which generation of dipole is illustrated by schematic diagram of the "B" atom, surrounded by "A" atoms, moving from a position P1 to a position P2 in the variable resistance pattern 106 of the ferroelectric capacitor. In the embodiments of the variable resistance pattern 106 of $Hf_{1-x}Zr_xO_2$, "A" atom represents Hf (Zr) and "B" atom represents oxygen. In some embodiments, the complete (saturation) switching polarization refers to as the polarization of dipole formed as "B" atom moves from the position P2 to a position P4, which can be measured in a major loop with the voltage VPL1 cycling from the positive voltage VP1 to the negative voltage VP1.

In some embodiments, the voltage VP1 is referred to as a positive saturation voltage and has a positive voltage value. The voltage VP2 is referred to as a reversal voltage VR and has a negative voltage value. The absolute value of the voltage VP1 is greater than the absolute value of the voltage VP2. In some embodiments, the voltage VP1 is around +3V and corresponds to an electric field of +3 MV/cm, and the voltage VP2 is around −1V and corresponds to an electric field of −1 MV/cm.

According to another embodiment, as shown by a negative polarity asymmetric minor loop (Neg. AmL) 302 in FIG. 3, the switching polarization ($\Delta 2P_r$) in the ferroelectric capacitor is expanded and half of the complete switching polarization is achieved as the voltage applied on the cell plate of the ferroelectric capacitor cycles from a voltage VN1 to a voltage VN2. In some embodiments, sufficient dipole switching response polarization is induced by the reversal field, in which generation of dipole is illustrated by schematic diagram of the "B" atom, surrounded by "A" atoms, moving from the position P1 to the position P4 in the variable resistance pattern 106 of the ferroelectric capacitor.

In some embodiments, the voltage VN1 is referred to as a negative saturation voltage and has a negative voltage value. The voltage VN2 is referred to as a reversal voltage VR and has a positive voltage value. The absolute value of the voltage VN1 is greater than the absolute value of the voltage VN2. In some embodiments, the voltage VN1 is around-3V and corresponds to an electric field of −3 MV/cm, and the voltage VN2 is around +1V and corresponds to an electric field of +1 MV/cm.

The configurations of FIG. 3 are given for illustrative purposes. Various implements are within the contemplated scope of the present disclosure. For example, in some embodiments, the voltages VP1, VP2, VN1, and VN2 depend on the factor x in the composition of $Hf_{1-x}Zr_xO_2$.

In some embodiments, the positive asymmetric minor loop and the negative asymmetric minor loop exhibit no disturbance readout and stable data retention $>10^4$ second with extrapolation to 10 years are applicable for multi-bit NVM.

In some embodiments, the positive asymmetric minor loop and the negative asymmetric minor loop are independent of each other. For example, in some embodiments, when a ferroelectric capacitor is cycled with the positive asymmetric minor loop to obtain half of the complete switching polarization generated by polarizing a first portion of structures (referred to positive (Pos.) AmL state portion hereinafter) in the ferroelectric capacitor, a second portion of structures (referred to negative (Neg.) AmL state portion hereinafter) in the ferroelectric capacitor remain non-polarized or unchanged until the ferroelectric capacitor is cycled with the negative asymmetric minor loop. Accordingly, after a sufficient amount of positive asymmetric minor loop cycling the Pos. AmL state portion of the ferroelectric capacitor, a significant degradation or fatigue of the $\Delta 2P_r$-V characteristic happens in the Pos. AmL state portion of the ferroelectric capacitor; whereas the remaining Neg. AmL state portion of the ferroelectric capacitor exhibits insignificant distortion of the $\Delta 2P_r$-V characteristic.

Furthermore, an opposing polarity cycling (referred to as asymmetric field cycling recovery (AFCR)) may provide the curing mechanism for recovery. For example, as shown in an embodiments of a ferroelectric capacitor 40 in FIG. 4, the ferroelectric capacitor 40 is configured with respect to, for example, the ferroelectric capacitor $C_{FE1}$ Or $C_{FE2}$ corresponding to FIGS. 1A-2. The ferroelectric capacitor 40 includes metal electrodes 41-42 and a resistance pattern 43 interposed between the metal electrodes. An interface layer 44 is formed between the metal electrode 41 and the resistance pattern 43, and an interface layer 45 is formed between the metal electrode 42 and the resistance pattern 43.

Figure 4:
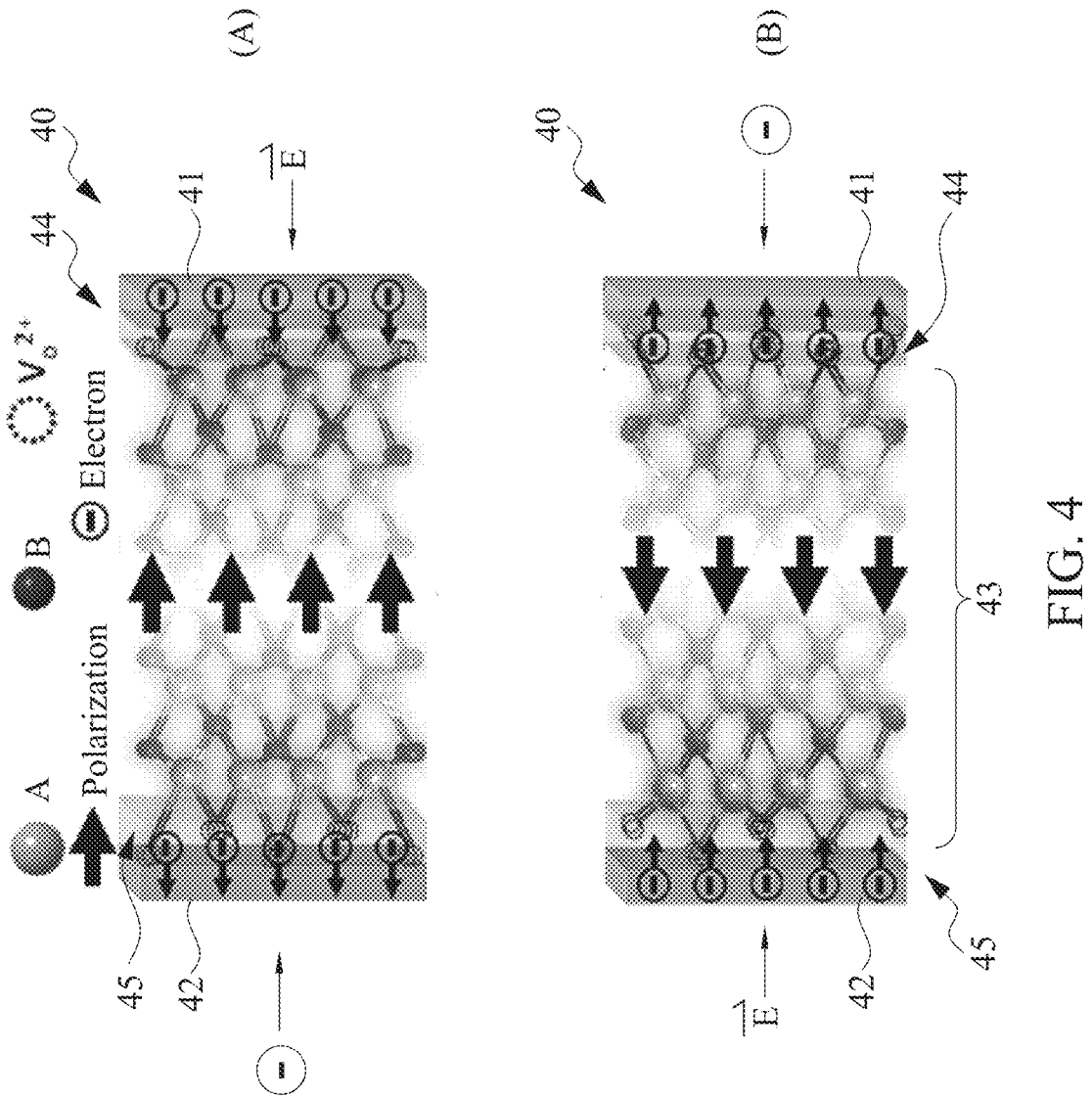
FIG. 4 illustrates part of a ferroelectric capacitor corresponding to FIG. 1A, in accordance with some embodiments.

Part (A) of FIG. 4 illustrates the Pos. AmL state portion in the ferroelectric capacitor 40. For illustration, the asymmetric polarization field (for example, by applying positive asymmetric minor loop) leads to electron injection and traps the electrons at the interface layer 44 to establish an inhomogeneous internal field, which induces imprint effect and prevents the dipoles from being flipped. It implies degradation of the switching polarization or fatigue (e.g., a first condition) of the Pos. AmL state portion in the ferroelectric capacitor 40. The opposing polarity cycling (for example, the negative asymmetric minor loop) is applied to recovery the fatigued Pos. AmL state portion in the ferroelectric capacitor 40. For example, the opposite asymmetric field is generated correspondingly and provides additional electron injection into the metal electrode 42, generating opposite internal field. Accordingly, detrapped electrons are released from the oxygen vacancy $Vo^{2+}$ to accomplish the recovery process of the ferroelectric capacitor 40. Alternatively stated, the portion of the first condition (fatigue) in the ferroelectric capacitor 40 changes to a second condition (recovery.)

Part (B) of FIG. 4 illustrates the Neg. AmL state portion in the ferroelectric capacitor 40 and is given for embodiments of fatigue induced by applying negative asymmetric minor loop. The configurations of recovery process are similar to part (A). Hence, the repetitious descriptions are omitted here.

Based on the discussion with reference to FIG. 4, during the AFCR operation, the Pos. AmL state portion in the ferroelectric capacitor 40 experiencing fatigue—the switching polarization thereof being around zero—are recovered by opposite electric field generated in performing the negative AmL cycling operation while polarizations of the Neg. AmL state portion in the ferroelectric capacitor 40 are established/altered simultaneously due to the negative AmL cycling operation.

Figures 5, 6:
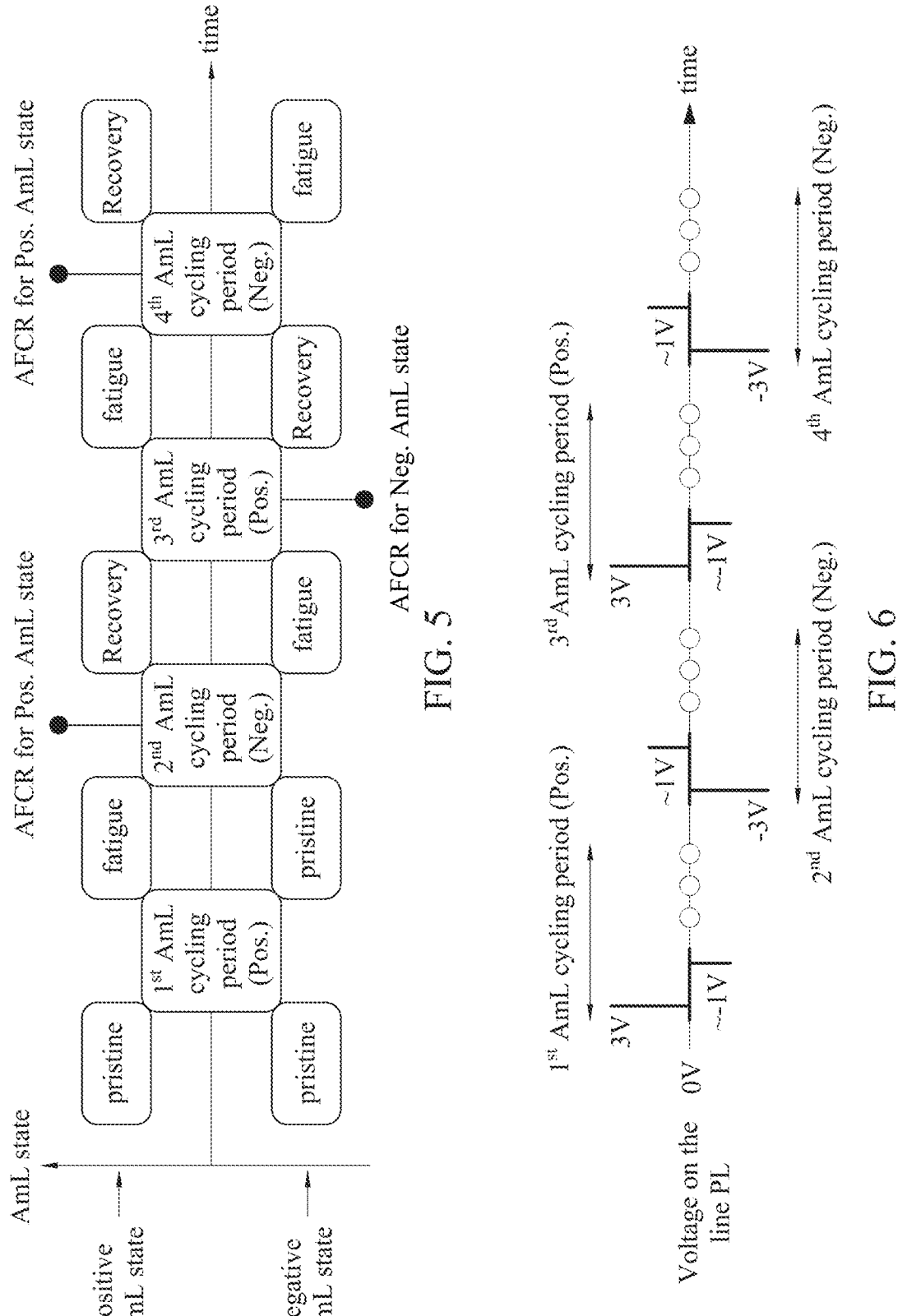
FIG. 5 is a chart illustrating asymmetric field cycling recovery (AFCR) operation with regard to the memory cell in accordance with some embodiments.
FIG. 6 is a chart illustrating operation description of FIG. 5.

FIG. 5 is a chart illustrating a flow of the asymmetric field cycling recovery (AFCR) operation with regard to a ferroelectric capacitor corresponding to the memory cell 11 or 12, in accordance with some embodiments. FIG. 6 is a chart illustrating operation description of FIG. 5, and FIGS. 7A-7C are charts of the switching polarization ($\Delta 2P_r$) corresponding to FIGS. 5-6, in accordance with some embodiments.

Reference is now made to FIGS. 1A-1B, 3 and 5-6. Taking the ferroelectric capacitor $C_{FE1}$ in the memory cells 11 as example, initially, the Pos. AmL state portion and the Neg. AmL state portion that are in the ferroelectric capacitor $C_{FE1}$ are pristine, as shown in FIG. 5.

During the first AmL cycling period, multiple positive (Pos.) AmL cycling operations are performed to the memory cell 11, resulting the Pos. AmL state portion eventually being fatigued (e.g., changes to the first condition); whereas the Neg. AmL state portion remain pristine. Specifically, the memory cell 11 is cycled with the voltage VP1 and the voltage VP2 of FIG. 3 by the control circuit 150 transmitting a pulse of the voltage VP1 (e.g., +3V) and then a pulse of the voltage VP2 (e.g., −1V) to the plate line PL for each Pos. AmL cycling operation, as shown in FIGS. 1A and 6. In some embodiments, the transmitting of pulses in the operations mentioned above is implemented in performing memory operations, for example, read and/or write operation, to the Pos. AmL state portion of the memory cell 11. In some embodiments, the Pos. AmL state portion reaches a fatigue threshold and is referred as fatigued. In some embodiments, the fatigue threshold implies that the switching polarization ($\Delta 2P_r$) of the Pos. AmL state portion decreases to around zero, as illustratively shown by a curve 701 in FIG. 7B which is a detailed diagram of part A in FIG. 7A. More specifically, the memory cell 11 experiences several Pos. AmL cycling operations (e.g., $5\times10^9$ cycles) in one AmL cycling period, and the switching polarization ($\Delta 2P_r$) of the Pos. AmL state portion declines to nearly zero.

With continued reference to FIG. 5, after the first AmL cycling period, the Pos. AmL state portion is fatigued and the Neg. AmL state portion remains pristine.

During the second AmL cycling period, multiple negative (Neg.) AmL cycling operations are performed to the memory cell 11, resulting the Neg. AmL state portion eventually being fatigued (e.g., changes to the first condition). Meanwhile, the fatigued Pos. AmL state portion undergoes the AFCR operation to be recovered (e.g., changes to the second condition) in response to the opposite electric field generated by the Neg. AmL cycling operations, as discussed with reference to FIG. 4.

Specifically, the memory cell 11 is cycled with the voltage VP1 and the voltage VP2 of FIG. 3 by the control circuit 150 transmitting a pulse of the voltage VN1 (e.g., −3V) and then a pulse of the voltage VN2 (e.g., +1V) to the plate line PL for each Neg. AmL cycling operation, as shown in FIGS. 1A and 6. In some embodiments, the transmitting of pulses in the operations mentioned above is implemented in performing memory operations, for example, read and/or write operation, to the Neg. AmL state portion of the memory cell 11. In some embodiments, the Neg. AmL state portion reaches a fatigue threshold and is referred as fatigued. In some embodiments, the fatigue threshold implies that the switching polarization ($\Delta 2P_r$) of the Neg. AmL state portion decreases to around zero, as illustratively shown a curve 702 in FIG. 7B which is a detailed diagram of part A in FIG. 7A. More specifically, the memory cell 11 experiences several Neg. AmL cycling operations (e.g., $5 \times 10^9$ cycles) in one AmL cycling period, and the switching polarization ($\Delta 2P_r$) of the Neg. AmL state portion declines to nearly zero.

With continued reference to FIG. 5, after the second AmL cycling period, the Pos. AmL state portion has a recovery state and the Neg. AmL state portion is fatigued.

The configurations in the third AmL cycling period are configured with respect to, for example, those in the first AmL cycling period. Specifically, the Pos. AmL state portion is recovered and capable to be polarized, as shown by a curve 703 in FIG. 7B at the beginning of the third AmL cycling period. Accordingly, multiple Pos. AmL cycling operations are performed to the memory cell 11, resulting the Pos. AmL state portion eventually being fatigued. Meanwhile, the fatigued Neg. AmL state portion undergoes the

10

Figures 7A, 7B, 7C:
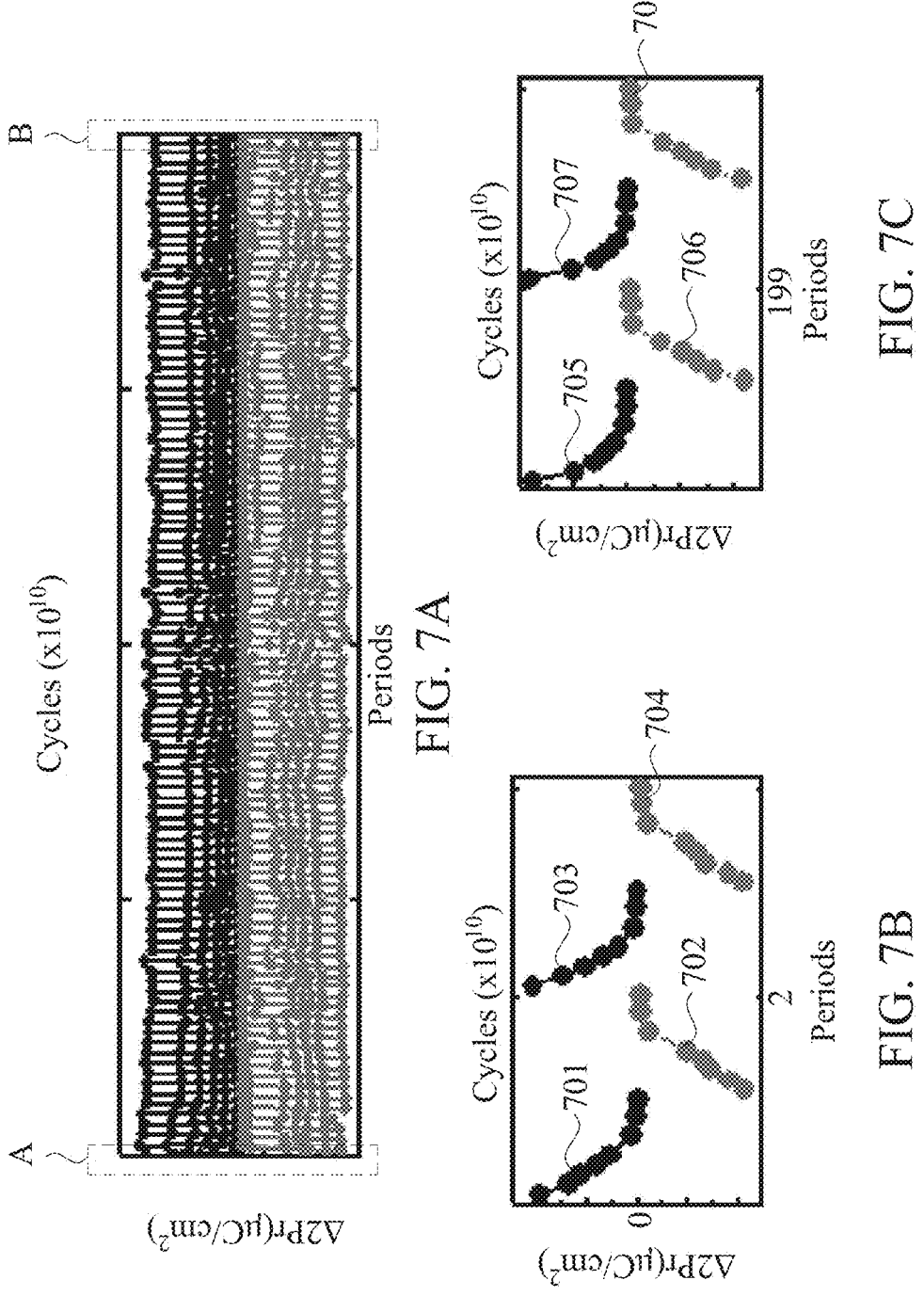
FIGS. 7A-7C are charts of the switching polarization ($\Delta 2Pr$) corresponding to FIGS. 5-6, in accordance with some embodiments.

Reference is now made to FIGS. 7A and 7C which is a detailed diagram of part B in FIG. 7A. FIG. 7C depicts curves 705 and 707 that correspond to the switching polarizations of the Pos. AmL state portion and curves 706 and 708 that correspond to the switching polarizations of the Neg. AmL state portion in the 199th and 200th AmL cycling period. For illustration, the switching polarizations remain almost the same as those depicted in FIG. 7B while the Pos. AmL state portion and the Neg. AmL state portion have undergone $10^{12}$ cycles in 200 period, demonstrating of long endurance of the memory cell 11 achieved by the AFCR operation and claiming the unlimited operation on applications of non-nolatile memory devices.

In some embodiments, an operation method of the memory device 10, implementing the AFCR operation, is presented as shown in table I below and with reference to FIGS. 1A-1B and 5-6. As shown in FIG. 1A, the control circuit 150 is configured to control the voltage VPL1 on the plate line PL to perform operations to the memory cells 11 and 12. The driver circuit 140 is configured to generate, in response to the voltage VPL1, the voltage VPL2. The voltage VPL2 is inverted from the voltage VPL1, according to some embodiments. Alternatively stated, the driver circuit 140 increases the voltage VPL2 (e.g., from VN1 to VN2) in response to decrease of the voltage VPL1 (e.g., from VP1 to VP2), and decreases the voltage VPL2 (e.g., from VN2 to VN1) in response to increase of the voltage VPL1 (e.g., from VP2 to VP1).

TABLE I

| Operation | | | C_FE1 in memory cell 11 | | C_FE2 in memory cell 12 | |
| --- | --- | --- | --- | --- | --- | --- |
| | | | Pos. AmL state portion | Neg. AmL state portion | Pos. AmL state portion | Neg. AmL state portion |
| Pos. AmL cycling operation | VPL1 (PL) | VP1(+3 V), VP2(−1 V) | Write/Read | Recovery | | |
| Neg. AmL cycling operation | VPL2 (PLB) | VN1(−3 V), VN2(+1 V) | | | Recovery | Write/Read |
| | VPL1 (PL) | VN1(−3 V), VN2(+1 V) | Recovery | Write/Read | | |
| Pos. AmL cycling operation | VPL2 (PLB) | VP1(+3 V), VP2(−1 V) | | | Write/Read | Recovery |

AFCR operation to be recovered in response to the opposite electric field generated by the Pos. AmL cycling operations, as discussed with reference to FIG. 4.

With continued reference to FIG. 5, after the third AmL cycling period, the Neg. AmL state portion has the recovery state and the Pos. AmL state portion is fatigued.

For the fourth AmL cycling period, the configurations in the fourth AmL cycling period are configured with respect to, for example, those in the second AmL cycling period. Specifically, the Neg. AmL state portion is recovered and capable to be polarized, as shown by a curve 704 in FIG. 7B at the beginning of the fourth AmL cycling period. Accordingly, multiple Neg. AmL cycling operations are performed to the memory cell 11, resulting the Neg. AmL state portion eventually being fatigued. Meanwhile, the fatigued Pos. AmL state portion undergoes the AFCR operation to be recovered in response to the opposite electric field generated by the Neg. AmL cycling operations, as discussed with reference to FIG. 4.

With continued reference to FIG. 5, after the fourth AmL cycling period, the Pos. AmL state portion has the recovery state and the Neg. AmL state portion is fatigued.

For example, the Pos. AmL cycling operations are performed to the memory cell 11 to recover the Neg. AmL state portion of the ferroelectric capacitor $C_{FE1}$ and simultaneously the Neg. AmL cycling operations are performed to the Neg. AmL state portion of the memory cell 12 for write/read operation until the Neg. AmL state portion of the memory cell 12 is fatigued.

Specifically, with reference to FIG. 6, the memory cell 11 is cycled with the voltage VP1 (e.g., +3V) and the voltage VP1 (e.g., −1V) in the Pos. AmL cycling operations. The Neg. AmL state portion of the memory cell 11 is undergoing a recovery operation due to the opposite electric field while the Pos. AmL state portion of the memory cell 11 is polarized during the Pos. AmL cycling operations.

Furthermore, with reference to FIG. 6, the memory cell 12 is cycled with the voltage VN1 (e.g., −3V) and the voltage VN2 (e.g., +1V) in the Neg. AmL cycling operations. The Pos. AmL state portion of the memory cell 12 is undergoing a recovery operation due to the opposite electric field while the Neg. AmL state portion of the memory cell 11 is polarized during the Neg. AmL cycling operations.

In some embodiments, after the Neg. AmL state portion of the ferroelectric capacitor $C_{FE1}$ recovers, the Neg. AmL cycling operations are performed to the Neg. AmL state portion of the memory cell 11 for write/read operation until the Neg. AmL state portion of the memory cell 11 is fatigued. Simultaneously the Pos. AmL cycling operations are performed to the memory cell 12 to recover the Neg. AmL state portion of the ferroelectric capacitor $C_{FE2}$ that is fatigued.

Specifically, with reference to FIG. 6, the memory cell 11 is cycled with the voltage VN1 (e.g., −3V) and the voltage VN2 (e.g., +1V) in the Neg. AmL cycling operations. The Pos. AmL state portion of the memory cell 11 is undergoing a recovery operation due to the opposite electric field while the Neg. AmL state portion of the memory cell 11 is polarized during the Neg. AmL cycling operations.

Furthermore, with reference to FIG. 6, the memory cell 12 is cycled with the voltage VP1 (e.g., +3V) and the voltage VP2 (e.g., −1V) in the Pos. AmL cycling operations. The Neg. AmL state portion of the memory cell 12 is undergoing a recovery operation due to the opposite electric field while the Pos. AmL state portion of the memory cell 12 is polarized during the Pos. AmL cycling operations.

Figure 8B:
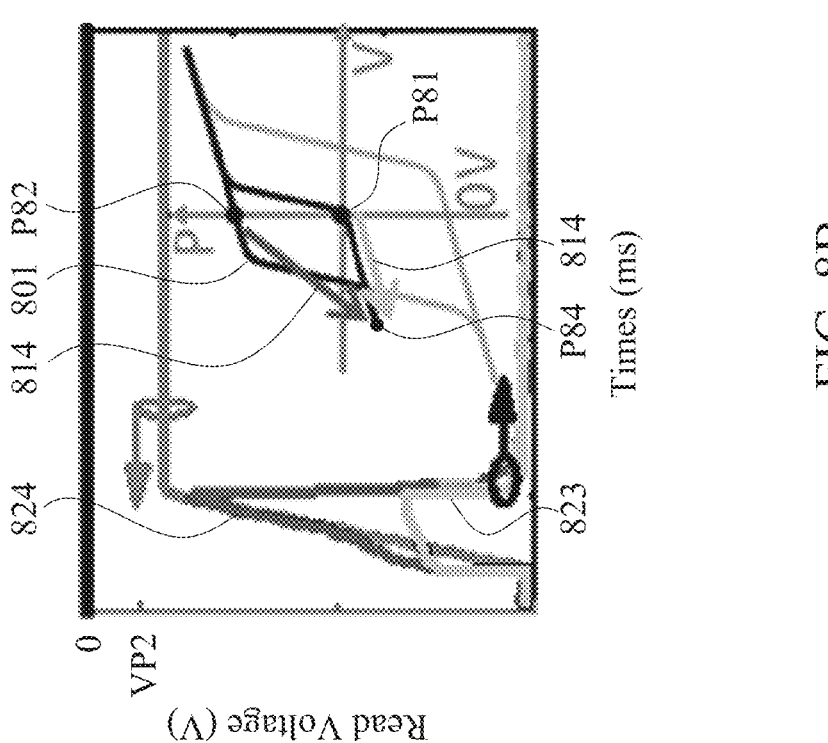
FIGS. 8A-8B show read current-time characteristic, read voltage characteristic, and the polarization-voltage (P-V) characteristic with regard to the Pos. AmL state portion of a memory cell in FIGS. 1A-7C, in accordance with some embodiments.
Figure 8A:
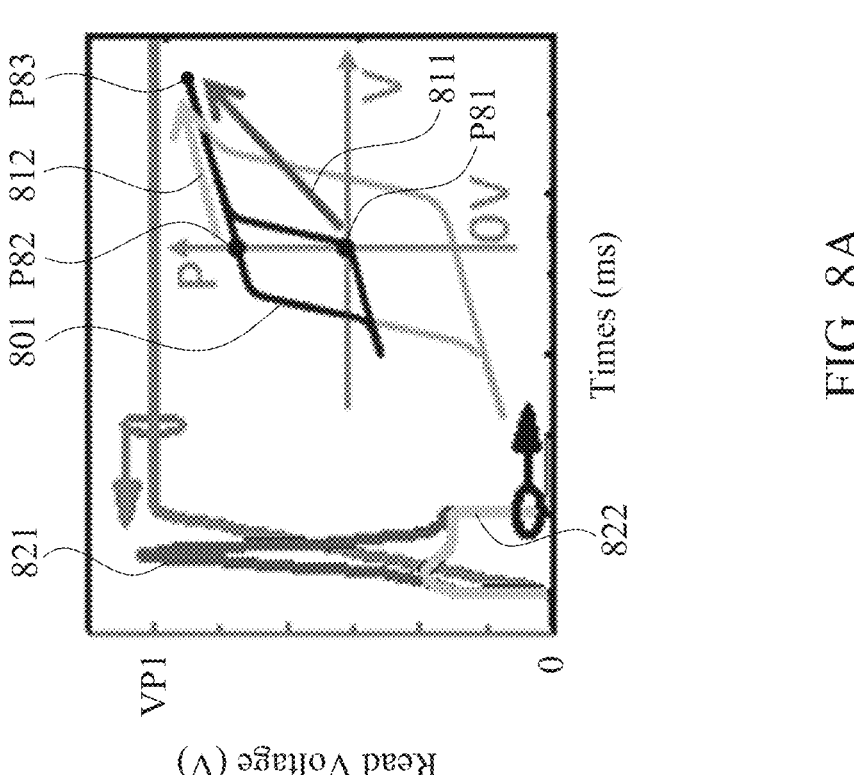

Reference is now made to FIGS. 8A-8B. FIGS. 8A-8B show read current-time characteristic, read voltage characteristic, and the polarization-voltage (P-V) characteristic with regard to the Pos. AmL state portion of a memory cell, for example, the memory cell 11, in FIGS. 1A-7C, in accordance with some embodiments.

For illustration, with reference to FIG. 1A, in a read operation of the stored state of the Pos. AmL state portion of the ferroelectric capacitor, for example the CFE1 in memory cell 11, the voltage VPL1 having the value of the voltage VP1 in FIG. 3 (e.g., +3V) may be applied across the ferroelectric capacitor CFE1 through the plate line PL when the bit line is ground. In response, the polarization, P, changes, and the degree of the change depends on the initial polarization. For example, a hysteresis curve 801 in FIG. 8A corresponding to the Pos. AmL state portion illustrates two possible polarization states P81 and P82. In response to the voltage VPL1 being the voltage VP1, the polarization of the Pos. AmL state portion changes from the polarization state P81 to the polarization state P83, which is indicated by path 811 and induces a significant switching current (read current) 821 to the bit line. Accordingly, when the sense circuit 120 senses the switching current 821 and determines that the memory cell 11 has a data state corresponding to the polarization P81, for example, logic "0". Likewise, when the polarization of the Pos. AmL state portion changes from the polarization state P82 to the polarization state P83, which is indicated by path 812 and induces a small non-switching current (read current) 822 to the bit line. Accordingly, when the sense circuit 120 senses the non-switching current 822 and determines that the memory cell 11 has a data state corresponding to the polarization P82, for example, logic "1".

In various embodiments of reading the stored state of the Pos. AmL state portion, the voltage VPL1 having the value of the voltage VP2 in FIG. 3 (e.g., −1V) may be applied across the ferroelectric capacitor CHEI through the plate line PL when the bit line is ground. For example, as shown in FIG. 8B, in response to the voltage VPL1 being the voltage VP2, the polarization of the Pos. AmL state portion changes from the polarization state P81 to the polarization state P84, which is indicated by path 813 and induces a small non-switching current (read current) 823 to the bit line. Accordingly, when the sense circuit 120 senses the non-switching current 823 and determines that the memory cell 11 has a data state corresponding to the polarization P81, for example, logic "0". Likewise, when the polarization of the Pos. AmL state portion changes from the polarization state P82 to the polarization state P84, which is indicated by path 814 and induces a significant switching current 824 to the bit line. Accordingly, when the sense circuit 120 senses the switching current 824 (read current) and determines that the memory cell 11 has a data state corresponding to the polarization P82, for example, logic "1".

Figure 9B:
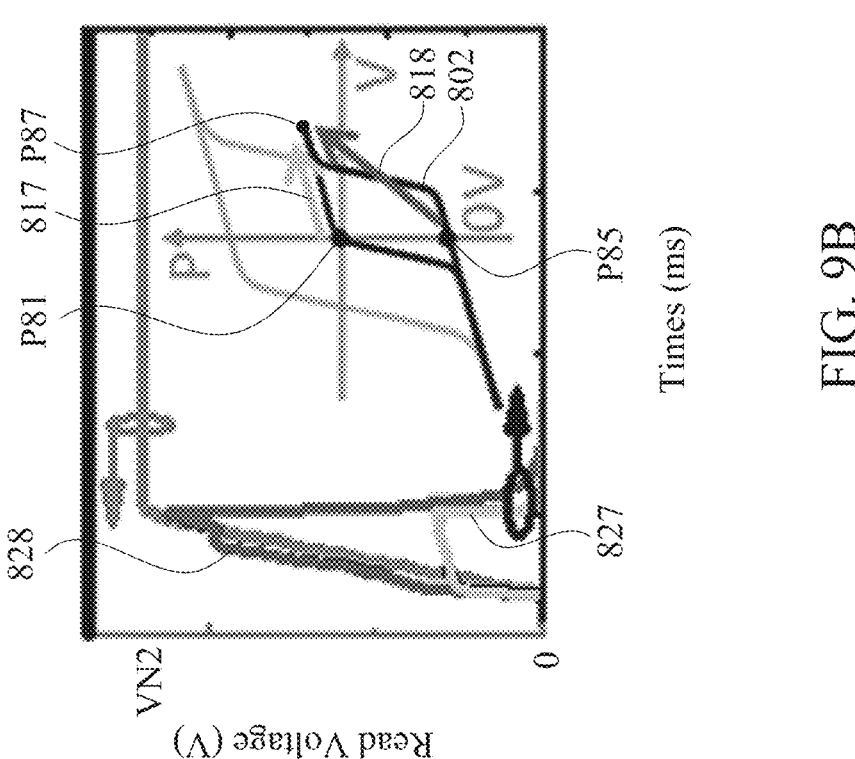
FIGS. 9A-9B show read current-time characteristic, read voltage characteristic, and the polarization-voltage (P-V) characteristic with regard to the Neg. AmL state portion of a memory cell in FIGS. 1A-7C, in accordance with some embodiments.
Figure 9A:
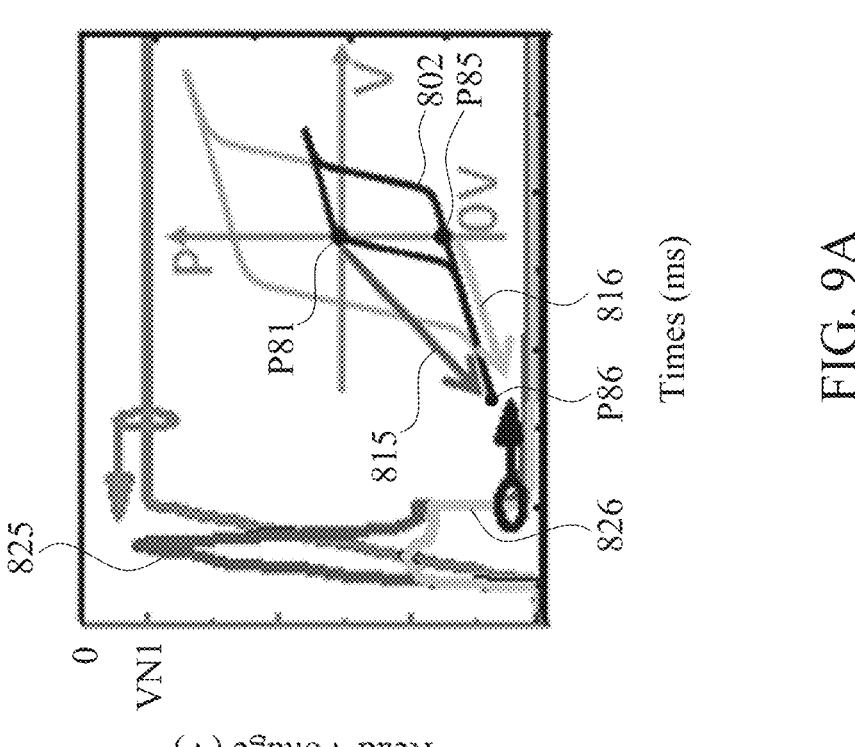

Reference is now made to FIGS. 9A-9B. FIGS. 9A-9B show read current-time characteristic, read voltage characteristic, and the polarization-voltage (P-V) characteristic with regard to the Neg. AmL state portion of a memory cell, for example, the memory cell 11, in FIGS. 1A-7C, in accordance with some embodiments.

For illustration, with reference to FIG. 1A, in a read operation the stored state of the Neg. AmL state portion of the ferroelectric capacitor, for example the $C_{FE1}$ in memory cell 11, the voltage VPL1 having the value of the voltage VN1 in FIG. 3 (e.g., −3V) may be applied across the ferroelectric capacitor $C_{FE1}$ through the plate line PL when the bit line is ground. In response, the polarization, P, changes, and the degree of the change depends on the initial polarization. For example, a hysteresis curve 802 in FIG. 9A corresponding to the Neg. AmL state portion illustrates two possible polarization states P81 and P85. In response to the voltage VPL1 being the voltage VN1, the polarization of the Neg. AmL state portion changes from the polarization state P81 to the polarization state P85, which is indicated by path 815 and induces a significant switching current 825 (read current) to the bit line. Accordingly, when the sense circuit 120 senses the switching current 825 and determines that the memory cell 11 has a data state corresponding to the polarization P81, for example, logic "0". Likewise, when the polarization of the Neg. AmL state portion changes from the polarization state P85 to the polarization state P86, which is indicated by path 816 and induces a small non-switching current (read current) 826 to the bit line. Accordingly, when the sense circuit 120 senses the non-switching current 826 and determines that the memory cell 11 has a data state corresponding to the polarization P85, for example, logic "1".

In various embodiments of reading the stored state of the Neg. AmL state portion, the voltage VPL1 having the value of the voltage VN2 in FIG. 3 (e.g., +1V) may be applied across the ferroelectric capacitor $C_{FE1}$ through the plate line PL when the bit line is ground. For example, as shown in FIG. 9B, in response to the voltage VPL1 being the voltage VN2, the polarization of the Neg. AmL state portion changes from the polarization state P81 to the polarization state P87, which is indicated by path 817 and induces a small non-switching current 827 to the bit line. Accordingly, when the sense circuit 120 senses the non-switching current (read current) 827 and determines that the memory cell 11 has a data state corresponding to the polarization P81, for example, logic "0". Likewise, when the polarization of the Neg. AmL state portion changes from the polarization state P85 to the polarization state P87, which is indicated by path 818 and induces a significant switching current (read current) 828 to the bit line. Accordingly, when the sense circuit 120 senses the switching current 828 and determines that the memory cell 11 has a data state corresponding to the polarization P85, for example, logic "1".

The configurations of the reading operation utilizing the voltages VP1, VP2, VN1, VN2 for the memory cell 12 are similar to those for the memory cell 11, which applies the voltages VP1, VP2, VN1, VN2 as the voltage VPL2. Hence, the repetitious descriptions are omitted here.

In some embodiments, the write operation for changing the data state in the memory cells 11 and 12 may be performed by utilizing the voltages VP1, VP2, VN1, VN2, according to the operations of the memory device 10.

In some approaches, high electric field is applied to the ferroelectric memory cells for recovery, which consumes significant power in cycling memory cells and also the memory devices experience time penalty during the recovery operation. Furthermore, due to the operational scheme, the ferroelectric memory cells are configured for one-bit operation by utilizing the complete switching polarization for storing data in the memory cells.

The present application provides a memory device and an operational method thereof, utilizing reduced operational voltage to generate half of the complete switching polarization for storing data in the memory cells. Moreover, the proposed asymmetric field cycling recovery operation enables simultaneous dual application of memory operation (write/read operation) to a portion of the ferroelectric capacitor and recovery operation to the other portion of the ferroelectric capacitor, which achieves a recovery time ration of 0% and indicates no extra recovery time for non-volatile memory (NVM). Moreover, in some embodiments, the proposed asymmetric field cycling recovery operation is applied through a driver circuit coupled between two different ferroelectric memory cells to execute memory operations and the recovery operations on two memory cells, improving the feasibility of operations of the memory device. Accordingly, compared with some approaches, lower power consumption and zero recovery time of the memory device are provided. With the configurations of the present application, endurance of the memory device is secured.

According to some embodiments, a memory device is provided and includes multiple first memory cells each having a first terminal coupled to a first node and a second terminal coupled to a corresponding one in multiple first bit lines; multiple second memory cells each having a first terminal coupled to a second node and a second terminal coupled to a corresponding one in multiple second bit lines; and a driver circuit coupled between the first node and the second node, and configured to generate, in response to a first voltage at the first node, a second voltage at the second node when a memory operation is performed to one of the first memory cells. The first voltage and the second voltage have different polarity.

In some embodiments, the memory device includes a plate line coupled to the first node to transmit the first voltage to the first memory cells and an input terminal of the driver circuit. An output terminal of the driver circuit is coupled to the second node.

In some embodiments, the driver circuit includes an inverting amplifier having a first input terminal receiving the first voltage, a second input terminal coupled to a ground, and an output terminal coupled to the second node.

In some embodiments, the driver circuit further includes a first resistor coupled between the first input terminal and the first node and a second resistor coupled between the first input terminal and the second node.

In some embodiments, the first input terminal is a negative input of the inverting amplifier, and the second input terminal is a positive input of the inverting amplifier.

In some embodiments, the first memory cells and the second memory cells are ferroelectric memory cells.

In some embodiments, the first voltage and the second voltage have a same absolute value.

In some embodiments, the driver circuit is further configured to increase, in response to the first voltage decreasing to have a first voltage value, the second voltage to have a second voltage value greater than the first voltage value.

In some embodiments, the driver circuit is further configured to decrease, in response to the first voltage increasing from the first voltage value to a third voltage value, the second voltage from the second voltage value to a fourth voltage value. An absolute value of the second voltage value is different from an absolute value of the third voltage value.

According to some embodiments, an operation method of a memory device is provided and includes operations of performing multiple cycling operations of a first polarity to a first memory cell to recover a first portion of the first memory cell that is of a first condition and simultaneously performing multiple cycling operations of a second polarity to a first portion of a second memory cell until the first portion of the second memory cell changes to the first condition. The first polarity and the second polarity are different from each other.

In some embodiments, performing the cycling operations of the first polarity to the first memory cell to recover the first portion of the first memory cell includes cycling the first memory cell with a first positive voltage and a first negative voltage. Absolute values of the first positive voltage and the first negative voltage are different from each other.

In some embodiments, the absolute value of the first positive voltage is greater than that of the first negative voltage.

In some embodiments, performing the cycling operations of the second polarity to the second memory cell until the first portion of the second memory cell is of the first condition includes cycling the second memory cell with a second negative voltage and a second positive voltage. The absolute value of the first positive voltage and an absolute value of the second negative voltage are the same. The absolute values of the first negative voltage and an absolute value of the second positive voltage are the same.

In some embodiments, wherein when the cycling operations of the first polarity are performed to the first memory cell, a second portion of the first memory cell changes to the first condition. When the cycling operations of the second polarity are performed to the second memory cell, a second portion of the second memory cell changes to a second condition different from the first condition.

In some embodiments, the operation method further includes operations of after the first portion of the first memory cell recovers to be of a second condition different from the first condition performing the cycling operations of the second polarity to the first memory cell until the first portion of the first memory cell is of the first condition and simultaneously performing the cycling operations of the first polarity to the first portion of the second memory cell to recover the first portion of the second memory cell that is of the first condition.

In some embodiments, the first memory cell is coupled between a first bit line and an input terminal of a driver circuit, and the second memory cell is coupled between a second bit line and an output terminal of the driver circuit. The operation method further includes inverting, by the driver circuit, a first voltage at the input terminal to a second voltage at the output terminal.

According to some embodiments, a memory device is provided and includes a first memory cell having a first terminal coupled to a plate line and a second terminal coupled to a first bit line; a driver circuit having a first terminal coupled to the plate line; a second memory cell having a first terminal coupled to a second terminal of the driver circuit and a second terminal coupled to a second bit line; and a control circuit configured to control a first voltage on the plate line to perform a memory operation to a first portion of the first memory cell. The driver circuit is configured to generate, in response to the first voltage, a second voltage at the second terminal thereof for performing a recovery operation to a first portion of the second memory cell.

In some embodiments, the first voltage and the second voltage have different polarity, and the first voltage and the second voltage have a same absolute value.

In some embodiments, the first memory cell includes a first ferroelectric capacitor having a first cell bottom and a first cell plate coupled to the first terminal of the driver circuit and a first selection component coupled between the first cell bottom and the first bit line.

In some embodiments, the second memory cell includes a second ferroelectric capacitor having a second cell bottom and a second cell plate coupled to the second terminal of the driver circuit and a second selection component coupled between the second cell bottom and the second bit line. The driver circuit includes an inverting amplifier having an input terminal coupled to the first terminal of the driver circuit and an output terminal coupled to the second terminal of the driver circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
a plurality of first memory cells each having a first terminal coupled to a first node, a second terminal coupled to a corresponding one of a plurality of first bit lines, and a third terminal coupled to a corresponding one of a plurality of word lines, wherein the first node is separated from the plurality of word lines;
a plurality of second memory cells each having a first terminal coupled to a second node, a second terminal coupled to a corresponding one of a plurality of second bit lines, and a third terminal coupled to a corresponding one of the plurality of word lines; and
a driver circuit coupled between the first node and the second node, and configured to generate, in response to a first voltage at the first node, a second voltage at the second node when a memory operation is performed to one of the plurality of first memory cells,
wherein the first voltage and the second voltage have different polarity.

2. The memory device of claim 1, further comprising:
a plate line coupled to the first node to transmit the first voltage to the plurality of first memory cells and an input terminal of the driver circuit,
wherein an output terminal of the driver circuit is coupled to the second node.

3. The memory device of claim 1, wherein the driver circuit comprises:

an inverting amplifier having a first input terminal receiving the first voltage, a second input terminal coupled to a ground, and an output terminal coupled to the second node.

4. The memory device of claim 3, wherein the driver circuit further comprises:
a first resistor coupled between the first input terminal and the first node; and
a second resistor coupled between the first input terminal and the second node.

5. The memory device of claim 3, wherein the first input terminal is a negative input of the inverting amplifier, and the second input terminal is a positive input of the inverting amplifier.

6. The memory device of claim 1, wherein the plurality of first memory cells and the plurality of second memory cells are ferroelectric memory cells.

7. The memory device of claim 1, wherein the first voltage and the second voltage have a same absolute value.

8. The memory device of claim 1, wherein the driver circuit is further configured to increase, in response to the first voltage decreasing to have a first voltage value, the second voltage to have a second voltage value greater than the first voltage value.

9. The memory device of claim 8, wherein the driver circuit is further configured to decrease, in response to the first voltage increasing from the first voltage value to a third voltage value, the second voltage from the second voltage value to a fourth voltage value,
wherein an absolute value of the second voltage value is different from an absolute value of the third voltage value.

10. An operation method of a memory device, comprising:
performing a plurality of cycling operations of a first polarity to a first memory cell to recover a first portion of the first memory cell that is of a first condition and simultaneously performing a plurality of cycling operations of a second polarity to a first portion of a second memory cell until the first portion of the second memory cell changes to the first condition,
wherein the first polarity and the second polarity are different from each other.

11. The operation method of claim 10, wherein performing the plurality of cycling operations of the first polarity to the first memory cell to recover the first portion of the first memory cell comprises:
cycling the first memory cell with a first positive voltage and a first negative voltage, wherein absolute values of the first positive voltage and the first negative voltage are different from each other.

12. The operation method of claim 11, wherein the absolute value of the first positive voltage is greater than that of the first negative voltage.

13. The operation method of claim 11, wherein performing the plurality of cycling operations of the second polarity to the second memory cell until the first portion of the second memory cell is of the first condition comprises:
cycling the second memory cell with a second negative voltage and a second positive voltage,
wherein the absolute value of the first positive voltage and an absolute value of the second negative voltage are the same, and
the absolute values of the first negative voltage and an absolute value of the second positive voltage are the same.

14. The operation method of claim 10, wherein when the plurality of cycling operations of the first polarity are performed to the first memory cell, a second portion of the first memory cell changes to the first condition, wherein when the plurality of cycling operations of the second polarity are performed to the second memory cell, a second portion of the second memory cell changes to a second condition different from the first condition.

15. The operation method of claim 10, further comprising:

after the first portion of the first memory cell recovers to be of a second condition different from the first condition, performing the plurality of cycling operations of the second polarity to the first memory cell until the first portion of the first memory cell is of the first condition and simultaneously performing the plurality of cycling operations of the first polarity to the first portion of the second memory cell to recover the first portion of the second memory cell that is of the first condition.

16. The operation method of claim 10, wherein the first memory cell is coupled between a first bit line and an input terminal of a driver circuit, and the second memory cell is coupled between a second bit line and an output terminal of the driver circuit, wherein the operation method further comprises:

inverting, by the driver circuit, a first voltage at the input terminal to a second voltage at the output terminal.

17. A memory device, comprising:

a first memory cell having a first terminal coupled to a plate line and a second terminal coupled to a first bit line;

a driver circuit having a first terminal coupled to the plate line;

a second memory cell having a first terminal coupled to a second terminal of the driver circuit and a second terminal coupled to a second bit line; and a control circuit configured to control a first voltage on the plate line to perform a memory operation to a first portion of the first memory cell, wherein the driver circuit is configured to generate, in response to the first voltage, a second voltage at the second terminal thereof for performing a recovery operation to a first portion of the second memory cell.

18. The memory device of claim 17, wherein the first voltage and the second voltage have different polarity, and the first voltage and the second voltage have a same absolute value.

19. The memory device of claim 17, wherein the first memory cell comprises:

a first ferroelectric capacitor having a first cell bottom and a first cell plate coupled to the first terminal of the driver circuit; and a first selection component coupled between the first cell bottom and the first bit line.

20. The memory device of claim 19, wherein the second memory cell comprises:

a second ferroelectric capacitor having a second cell bottom and a second cell plate coupled to the second terminal of the driver circuit; and a second selection component coupled between the second cell bottom and the second bit line, wherein the driver circuit comprises:

an inverting amplifier having an input terminal coupled to the first terminal of the driver circuit and an output terminal coupled to the second terminal of the driver circuit.

* * * * *